(12) United States Patent
Avramescu et al.

(10) Patent No.: US 11,069,835 B2
(45) Date of Patent: Jul. 20, 2021

(54) OPTOELECTRONIC SEMICONDUCTOR CHIP AND METHOD OF MANUFACTURING THE SAME

(71) Applicant: OSRAM Opto Semiconductors GmbH, Regensburg (DE)

(72) Inventors: Adrian Stefan Avramescu, Regensburg (DE); Tansen Varghese, Regensburg (DE); Martin Straßburg, Donaustauf (DE); Hans-Jürgen Lugauer, Sinzing (DE); Sönke Fündling, Braunschweig (DE); Jana Hartmann, Braunschweig (DE); Frederik Steib, Wolfsburg (DE); Andreas Waag, Würzburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/495,803

(22) PCT Filed: Mar. 16, 2018

(86) PCT No.: PCT/EP2018/056654
§ 371 (c)(1),
(2) Date: Sep. 19, 2019

(87) PCT Pub. No.: WO2018/172205
PCT Pub. Date: Sep. 27, 2018

(65) Prior Publication Data
US 2020/0028029 A1     Jan. 23, 2020

(30) Foreign Application Priority Data
Mar. 20, 2017   (DE) .......................... 102017105943.1

(51) Int. Cl.
*H01L 33/20*     (2010.01)
*H01L 25/075*     (2006.01)
*H01L 33/00*     (2010.01)

(52) U.S. Cl.
CPC .......... *H01L 33/20* (2013.01); *H01L 25/0753* (2013.01); *H01L 33/0025* (2013.01); *H01L 33/0066* (2013.01)

(58) Field of Classification Search
None
See application file for complete search history.

(56) References Cited

U.S. PATENT DOCUMENTS

| 9,214,600 | B2 | 12/2015 | Mandl et al. |
| 2010/0176375 | A1* | 7/2010 | Lochtefeld .............. H01L 33/06 257/14 |

(Continued)

FOREIGN PATENT DOCUMENTS

WO     2013127672 A1     9/2013

OTHER PUBLICATIONS

Hartmann, J. et al., "High Aspect Ratio GaN Fin Microstructures with Nonpolar Sidewalls by Continuous Mode Metalorganic Vapor Phase Epitaxy," Crystal Growth & Design, ACS Publications, American Chemical Society, vol. 16; No. 3; DOI: 10.1021/acs.cgd5b01598, Feb. 3, 2016, 6 pages.

(Continued)

*Primary Examiner* — J. E. Schoenholtz
(74) *Attorney, Agent, or Firm* — Slater Matsil, LLP

(57) ABSTRACT

An optoelectronic semiconductor chip and a method for manufacturing a semiconductor chip are disclosed. In an embodiment an optoelectronic semiconductor chip includes a plurality of fins and a current expansion layer for common contacting of at least some of the fins, wherein each fin includes two side surfaces arranged opposite one another (Continued)

and an active region arranged on each of the side surfaces, wherein the plurality of fins include inner fins and outer fins having an adjacent fin only on one side, and wherein the current expansion layer is in direct contact with the inner fins on their outside.

16 Claims, 20 Drawing Sheets

(56) References Cited

U.S. PATENT DOCUMENTS

2016/0133787 A1    5/2016   Lochtefeld
2016/0163918 A1*   6/2016   Dasgupta ............. H01L 27/153
                                                                                                        257/13

OTHER PUBLICATIONS

Hartmann, J. et al., "Study of 3D-Growth Conditions for Selective area MOVPE of High Aspect Ratio GaN Fins with Non-Polar Vertical Sidewalls," Journal of Crystal Growth, No. 476, Aug. 18, 2017, 9 pages.

Hartmann, J. et al., "Growth Mechanisms of GaN Microrods for 3D Core-Shell LEDs: The Influence of Silane Flow," Physical Status Solidi A, Applications and Materials Science, Wiley Online Library, DOI 10.1002/pssa.201532316, Aug. 26, 2015, 8 pages.

Paskova, T., "Nitrides with Nonpolar Surfaces," Wiley-VCH, Verlag GmbH & Co. KGaA, ISBN: 978-3-527-40768-2, 2008, 461 pages.

Rishinaramangalam, A.K. et al., "Controlled Growth of Ordered III-Nitride-Core Shell Nanostructure Arrays for Visible Optoelectronic Devices," Journal of Electronic Materials; vol. 44; No. 5, Oct. 21, 2014, 9 pages.

* cited by examiner

OPTOELECTRONIC SEMICONDUCTOR CHIP AND METHOD OF MANUFACTURING THE SAME

This patent application is a national phase filing under section 371 of PCT/EP2018/056654, filed Mar. 16, 2018, which claims the priority of German patent application 102017105943.1, filed Mar. 20, 2017, each of which is incorporated herein by reference in its entirety.

TECHNICAL FIELD

The present application refers to an optoelectronic semiconductor chip that can be operated particularly efficiently.

BACKGROUND

International Publication No. WO 2013/127672 describes an optoelectronic semiconductor chip.

SUMMARY OF THE INVENTION

Embodiments provide an optoelectronic semiconductor chip, for example, a light-emitting diode chip, a laser diode chip or a detector chip. Preferably, it is a radiation-emitting semiconductor chip that emits electromagnetic radiation in the spectral range between infrared radiation and UV radiation, in particular visible light, during operation.

According to at least one embodiment of the optoelectronic semiconductor chip, the semiconductor chip comprises at least one fin. A fin in this case is an elongated structure that extends along an imaginary straight line. The fin can have a longitudinal axis running parallel to this straight line. Within the manufacturing tolerance, the fin can be axially symmetrical to this longitudinal axis.

According to at least one embodiment of the semiconductor chip, the fin has two side surfaces which are arranged opposite one another. The two side surfaces can, for example, be symmetrical with respect to the longitudinal axis of the fin within the manufacturing tolerance.

According to at least one embodiment of the optoelectronic semiconductor chip, an active region is arranged on each of the side surfaces. The active region is the functional region of the optoelectronic semiconductor chip. This means that the radiation to be detected or the radiation to be generated is detected or generated, respectively, in this active region during operation of the optoelectronic semiconductor chip. In particular, it is possible that the active region on each side surface has the same design within the manufacturing tolerance. This means that, within the manufacturing tolerance, the active regions on each side surface generate electromagnetic radiation in the same wavelength range, for example.

The active regions of a fin, for example, are produced simultaneously using the same manufacturing method. The active regions of a fin are electrically connected to each other. The active regions can be physically connected so that the fin has a single active region that extends from one side surface of the fin to the other side surface of the fin over another surface, such as a cover surface or an end surface of the fin. It is also possible that the active regions of each side surface of the fin are not physically connected to each other, so that the fin has exactly one active region on each side surface. For example, the active regions of the fin can be electrically connected in parallel to each other via further components of the fin or the optoelectronic semiconductor chip.

According to at least one embodiment of the optoelectronic semiconductor chip, an optoelectronic semiconductor chip comprising at least one fin is specified, wherein the fin has two side surfaces which are arranged opposite one another, and an active region is arranged on each of the side surfaces.

An optoelectronic semiconductor chip described here is based, among other things, on the following considerations: an important loss mechanism, for example, in the operation of light-emitting diode chips, is the Auger effect. This effect leads to a reduced efficiency in the generation of electromagnetic radiation in the range of high current densities.

In order to maintain high efficiency, light-emitting diode chips are therefore often operated with low current densities, which can be achieved, for example, by designing the light-emitting diode chips with a larger base area. However, this approach leads to increased costs and larger components with these larger light-emitting diode chips.

Another way of reducing the losses due to the Auger effect is to increase the area of the active region of a light-emitting diode chip by growing the active region along rods or pyramids (so-called microrods). However, it is not possible to reduce the defect density in the semiconductor material of the optoelectronic semiconductor chip. However, defects, for example, dislocations, in the semiconductor material represent another loss mechanism, since defects in the semiconductor material lead to non-radiative recombinations at low currents. This leads to relatively low conversion efficiencies, especially in the non-polar or semipolar quantum well structures of such microrods.

It has now become apparent that an optoelectronic semiconductor chip with a fin on whose side surfaces an active region is arranged can increase the efficiency of the optoelectronic semiconductor chip. By arranging the active region on the side surfaces of the fin, the base area available for the active region is increased compared to a deposition on a flat surface. As a result, the optoelectronic semiconductor chip can be operated at a lower current density without having to increase the base area of the semiconductor chip.

In addition, it has been shown that the number of defects occurring during deposition is reduced compared to a microrod deposition. This means in particular that the number of structures that have not grown or have not grown completely is reduced, especially in the edge region. Finally, it is possible to deposit the active region exclusively on non-polar surfaces, which can lead to a reduction of piezoelectric effects, especially with III-V compound semiconductor materials, and thus to an improved charge carrier reception in the active region.

According to at least one embodiment of the optoelectronic semiconductor chip, the fin comprises end surfaces and a cover surface, wherein the area of each side surface is greater than the area of each end surface and the area of the cover surface. For example, the fin is applied to a substrate. The surface of the fin opposite the substrate forms the cover surface of the fin. The surfaces with the largest area are the side surfaces of the fin, which are connected to each other by the cover surface. Furthermore, the side surfaces are connected by at least two end surfaces which run transverse or perpendicular to the side surfaces.

With such a fin it is possible to arrange the active region on the largest surface of the fin, which leads to a further enlargement of the area of the active region and thus to a further reduction in current density.

According to at least one embodiment of the optoelectronic semiconductor chip, the fin is based on a III-V compound semiconductor material, in particular a nitride compound semiconductor material, and the side surfaces of the fin are parallel to the A-plane of the III-V compound semiconductor material. This means that the active region of the fin is arranged on an A-plane. This can be achieved, for example, by the fin extending parallel to the M-axis. For example, the fin extends parallel to the M-axis of a growth substrate and/or to the M-axis of a III-V compound semiconductor material layer disposed between the fin and the growth substrate.

The arrangement of the active region on a side surface parallel to the A-plane of the III-V compound semiconductor material allows the avoidance of piezoelectric fields and thus improved charge carrier capture, which further increases the efficiency of the optoelectronic semiconductor chip. For example, at least 90% of the total area of the active regions of the semiconductor chip is located on an A-plane.

According to at least one embodiment of the optoelectronic semiconductor chip, the fin has a length, a width and a height. The height is greater than the width and the ratio of height to width is at least 2, for example, at least 10, especially 40, 50 or more. Such a ratio of height to width can be achieved in particular by using metal-organic vapor phase epitaxy (MOVPE) to produce the fin.

According to at least one embodiment of the optoelectronic semiconductor chip, the length is greater than the height of the fin. The length is measured along the longitudinal extension direction of the fin which, for example, runs parallel to a main extension plane of the optoelectronic semiconductor chip, for example, along the M-axis. The height is determined in a vertical direction, which is transverse or perpendicular to the main extension plane of the optoelectronic semiconductor chip.

For example, a fin length of at least 10 µm is possible. For example, the length of the fin can be between at least 10 µm and at most 300 mm.

For example, the width of the fin can be at least 500 nm. In particular, it is possible that the width of the fin is at least 500 nm and at most 10000 nm.

For example, the height of the fin can be at least 3 µm. For example, it is possible that the height of the fin is at least 3 µm and at most 50 µm.

According to at least one embodiment of the optoelectronic semiconductor chip, the fin has a length which is at least 50% of an edge length of the optoelectronic semiconductor chip. For example, the length of the fin is at least 50% of the largest edge length of the semiconductor chip. This means that the fin can, for example, extend along an edge of the semiconductor chip and have a length which is at least half the edge length, in particular at least 75% or at least 85% of the edge length of the semiconductor chip. In this way it is possible to increase the area of the active region, which is arranged on the side surface of the fin, particularly strongly.

According to at least one embodiment of the optoelectronic semiconductor chip, the fin has a core formed with a III-V compound semiconductor material of a first conductivity type and/or the fin has a first shell formed with a III-V compound semiconductor material of a first conductivity type. The fin further has a second shell formed with a III-V compound semiconductor material of a second conductivity type different from the first conductivity type, the active region being arranged between the core and/or the first shell on the one hand and the second shell on the other hand. The semiconductor material of the first conductivity type is an n-conducting semiconductor material, for example. The semiconductor material of the second conductivity type is then formed with a p-conducting semiconductor material or vice versa.

The active region is arranged directly or indirectly on a core of the fin and covered by the second shell, so that the active region is arranged between n- and p-conducting regions of the semiconductor material used. For example, the active region may contain one or more quantum well structures for generating electromagnetic radiation.

According to at least one embodiment of the optoelectronic semiconductor chip, the optoelectronic semiconductor chip comprises a plurality of fins arranged parallel to each other. For example, the fins can be arranged next to each other in a direction perpendicular to the M-axis. For example, a distance between adjacent fins in this direction is between at least 1 µm and at most 100 µm, in particular at most 50 µm or at most 10 µm. In this way, it is possible to provide a plurality of fins in the optoelectronic semiconductor chip, which increases the area of the active region arranged on the side surfaces of each fin.

According to at least one embodiment of the optoelectronic semiconductor chip, it is alternatively or additionally possible that a plurality of fins arranged one behind the other along a straight line are present, the length of each fin extending along the straight line. This means that it is possible that along the M-axis, for example, many fins are arranged one behind the other. Parallel to these fins, further fins can be arranged, which are formed either by single, long fins or again by a plurality of shorter fins, which are arranged one behind the other along a straight line running parallel to the M-axis.

According to at least one embodiment of the optoelectronic semiconductor chip, the fins of the plurality of fins each have active regions of the same design. This means that, within the manufacturing tolerance, the active regions of the different fins are formed equally, so that they generate electromagnetic radiation in the same wavelength range during operation of the optoelectronic semiconductor chip, for example.

Deviating from this, however, it is also possible that different fins are formed differently in the optoelectronic semiconductor chip. For example, the concentration of a material, for example, the concentration of gallium and/or indium, may be different in the active region of different fins. This can be used to provide a radiation-emitting semiconductor chip that generates mixed-colored light rather than light of the same color. The different material concentrations can, for example, be achieved by varying the temperature locally during the manufacture of the fins, so that, for example, the active regions of different fins are produced at different temperatures.

Further, a method of manufacturing an optoelectronic semiconductor chip is specified. In particular, an optoelectronic semiconductor chip described here can be manufactured using this method. This means that all features disclosed for the method are also disclosed in the optoelectronic semiconductor chip and vice versa.

In accordance with at least one embodiment of the method, first a substrate is provided. The substrate is a growth substrate formed, for example, with sapphire. The growth surface of the sapphire substrate is in particular the C-plane of the sapphire substrate.

In a first method step, a mask layer with openings is formed on the substrate in which at least some of the openings extend parallel to each other. The mask layer does not have to be applied directly to the substrate, but it is particularly possible that at least one intermediate layer, which can be produced epitaxially, is arranged between the substrate and the mask layer. The mask layer, for example, is formed with an electrically insulating material such as a nitride or an oxide.

Subsequently, a fin is formed at at least some of the openings. In particular, it is possible that a fin is formed at each of the openings. For this purpose, for example, a core of the fin is produced in the area of the opening and subsequent layers and areas of the fin are formed on this core. The fin is produced in particular by means of metal-organic vapor phase epitaxy. This method makes it possible, in particular, to form fins with a particularly great height, so that a ratio between the height and width of the fin is at least 2.

The fins produced in this way have two side surfaces arranged opposite one another, and an active region is arranged on each of the side surfaces.

According to at least one embodiment of the method, at least some of the openings extend parallel to the M-axis of the substrate and/or the semiconductor material located between the substrate and the fin. It is also possible that all fins extend along this direction.

According to at least one embodiment of the optoelectronic semiconductor chip, the core of at least one fin is exposed and the core is covered by a contact finger. In particular, it is possible that this is the case for all fins of the optoelectronic semiconductor chip. For the fins, for example, the core is exposed in a direction perpendicular or transverse to the main direction of extension of the fins by etching and covered by a contact finger, which connects the fins electrically conductively. The contact finger, for example, is formed by a metal layer. In this way it is possible, for example, to connect the fins parallel to each other on the n-side.

According to at least one embodiment of the optoelectronic semiconductor chip, the second shell of the at least one fin is partially covered by a current expansion layer. This means that in areas of the fin where the core is not exposed, the second shell can be covered with a current expansion layer and be in direct contact with it. This can again be the case for all fins of the semiconductor chip, so that the fins are contacted together on the p-side by the current expansion layer, for example. In this way, the fins can be connected parallel to each other and, for example, be contacted by corresponding contacts which can be arranged parallel to the main direction of extension of the fins on both sides of the plurality of fins.

BRIEF DESCRIPTION OF THE DRAWINGS

In the following, the optoelectronic semiconductor chip described here as well as the method described here will be explained in more detail by means of exemplary embodiments and the corresponding figures.

The schematic representations of FIGS. 1A and 1B show fins for exemplary embodiments of optoelectronic semiconductor chips;

Figure 13A:
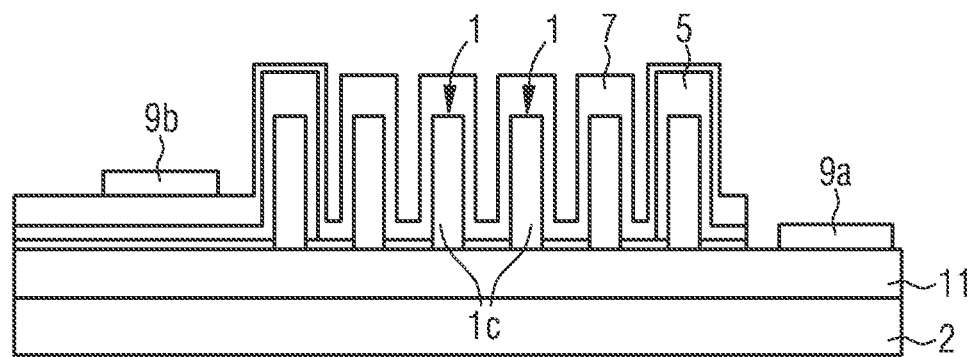
Figure 13B:
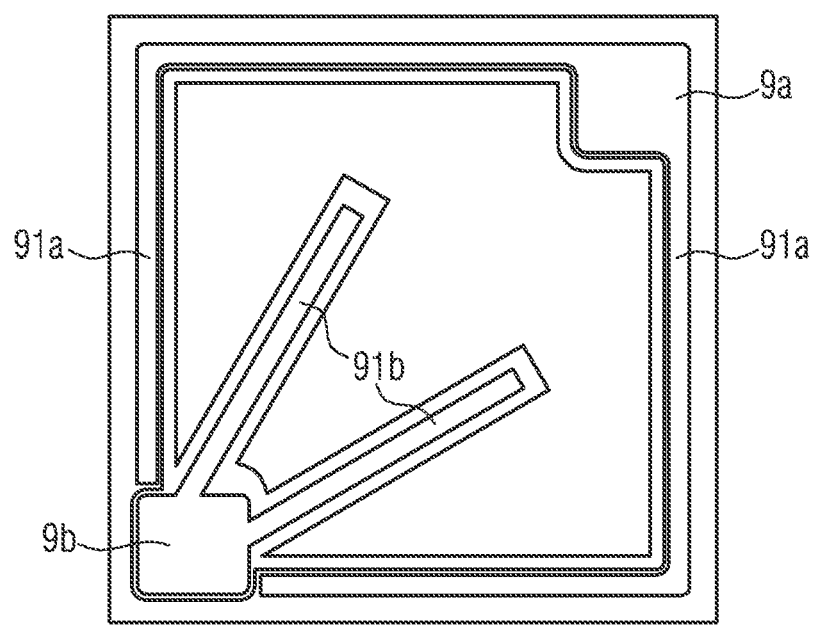
Figure 17A:
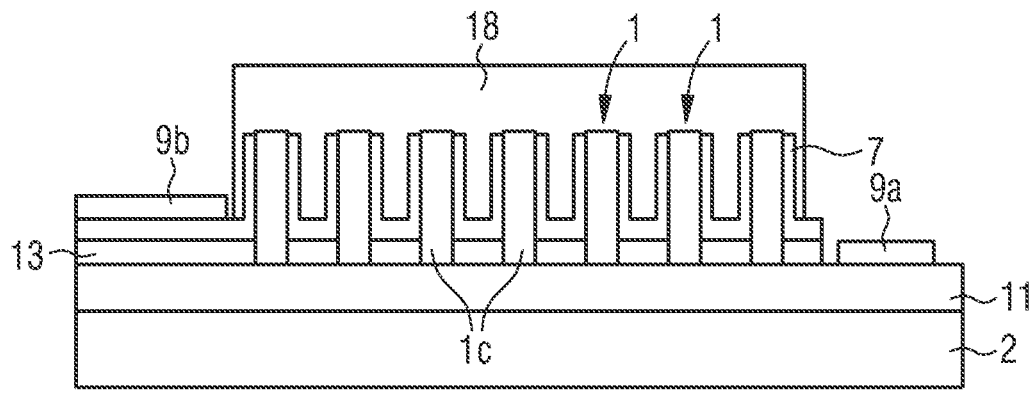
Figure 17B:
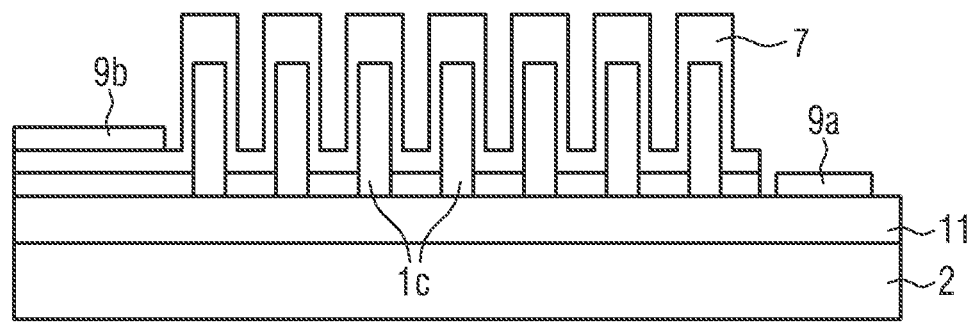
Figure 18A:
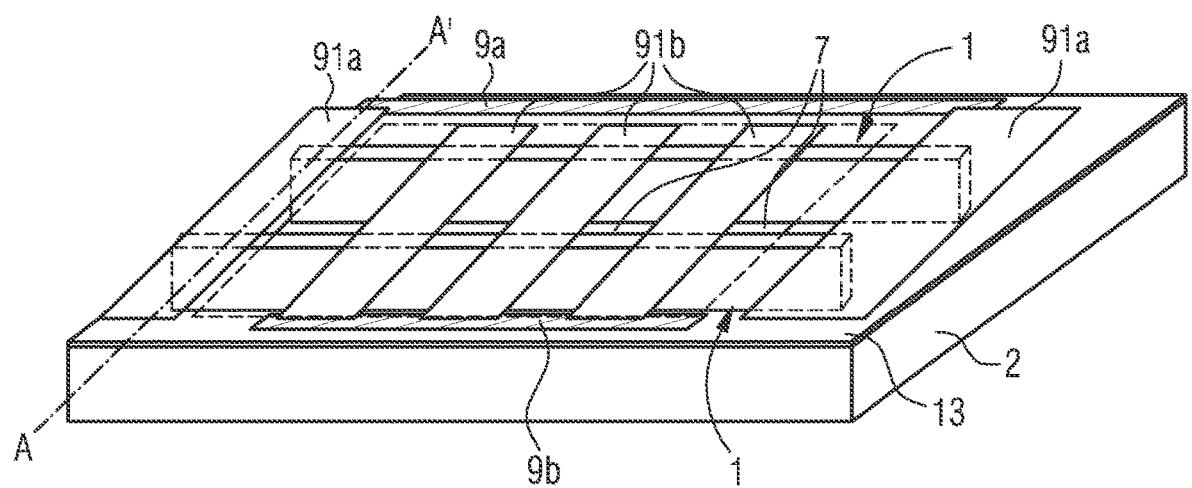
Figure 18B:
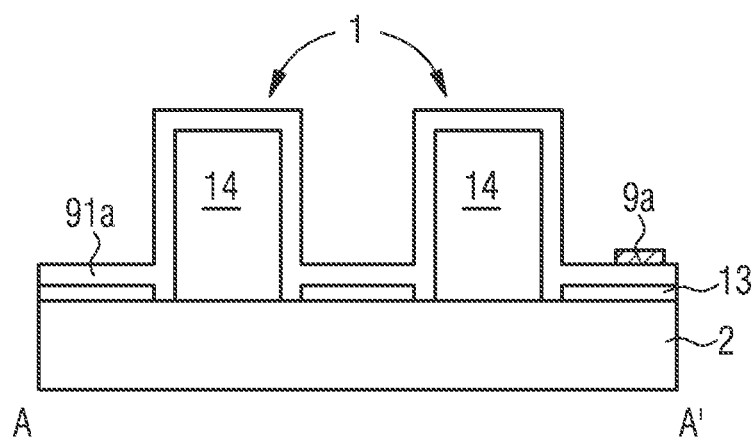

The schematic representations of FIGS. 2A, 2B, 2C, 2D, 2E illustrate in more detail an exemplary embodiment of a method;

The schematic representations of FIGS. 3A, 3B, 4A, 4B illustrate in more detail the fins for exemplary embodiments of optoelectronic semiconductor chips;

The schematic representations of FIGS. 5A, 5B, 5C, 6A, 6B, 6C, 7, 8A, 8B, 9A, 9B, 10A, 10B, 11A, 11B, 12A, 12B, 13A, 13B illustrate in more detail an exemplary embodiment of a method;

The schematic representations of FIGS. 13A, 13B show an exemplary embodiment of an optoelectronic semiconductor chip;

The schematic representations of FIGS. 14A, 14B, 14C, 15A, 15B, 16A, 16B, 17A, 17B, 17C illustrate in more detail an exemplary embodiment of a method;

FIGS. 17A and 17B show schematic representations of an exemplary embodiment of an optoelectronic semiconductor chip; and FIGS. 18A and 18B show schematic representations of a further exemplary embodiment of an optoelectronic semiconductor chip.

Identical, similar or identically acting elements are provided in the figures with the same reference signs. The figures and the proportions of the elements depicted in the figures are not to be regarded as true to scale. Rather, individual elements may be represented exaggeratedly large for better representability and/or better comprehensibility.

DETAILED DESCRIPTION OF ILLUSTRATIVE EMBODIMENTS

Figure 1A:
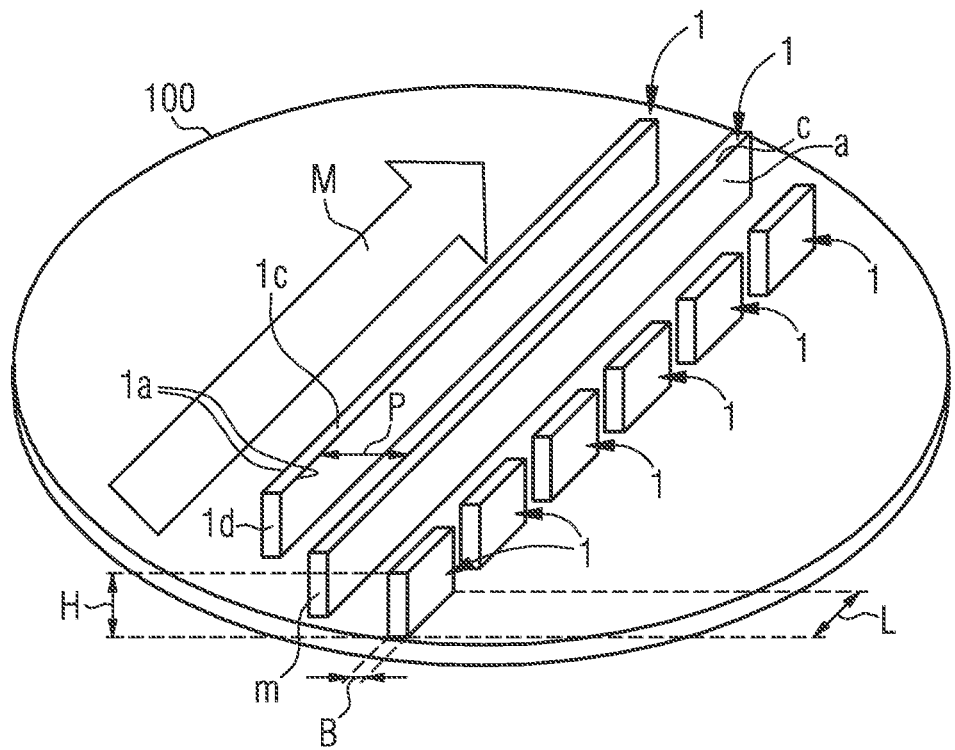
Figure 1B:
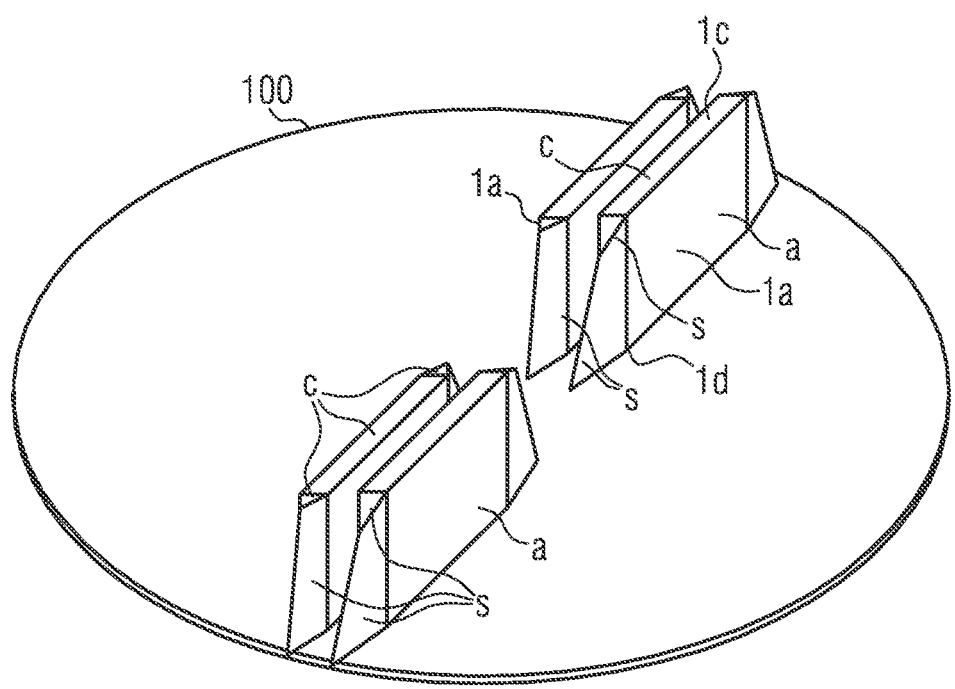

FIGS. 1A and 1B show schematic views of fins 1 for exemplary embodiments of optoelectronic semiconductor chips described here. The fins 1 comprise side surfaces 1a, a cover surface 1c and end surfaces 1d. The side surfaces is are the surfaces with the largest surface area of the fin.

Each fin also has a width B, a height H and a length L. The ratio of height H to width B of each fin 1 is at least 2.

The fins extend at a distance P from each other perpendicular to a longitudinal direction of extension of the fins 1.

For example, the distance P is at least 1 µm and at most 100 µm, the length L is at least 10 µm and at most 300 mm, the width B is at least 500 nm and at most 10000 nm and the height H is at least 3 µm and at most 50 µm or at most 1 mm.

The fins 1 extend, for example, in a direction parallel to the M-axis M of the layer on which they are applied.

As shown in FIG. 1B in particular, the cover surface 1c of the fins runs, for example, parallel to the C-plane c of the semiconductor material with which the fin 1 is formed. The end surfaces 1d can run parallel to the M-plane m of the semiconductor material. In particular, it is possible that the ends of fins 1 have end surfaces 1d which run parallel to semi-polar planes s of the semiconductor material.

The M-axis runs in the direction (−1100), the width B of the fins 1 is measured in the direction parallel to the A-axis (−1−120).

In connection with FIGS. 2A to 2E, an exemplary embodiment of a method described here is explained in more detail using schematic sectional representations.

Figure 2A:

In the method, a substrate 2 is first provided, see FIG. 2A. For example, the substrate 2 is a sapphire substrate that may be present as a sapphire wafer. For example, the substrate can have a diameter between 2 and 12".

Figure 2B:

In a next method step, FIG. 2B, at least one intermediate layer 11 is applied to the growth substrate 2. For example, the intermediate layer 11 may be formed with a III-V compound semiconductor material. The intermediate layer is deposited, for example, by metal-organic vapor phase epitaxy.

A III/V compound semiconductor material has at least one element from the third main group, such as B, Al, Ga, In, and one element from the fifth main group, such as N, P, As. In particular, the term "III/V compound semiconductor material" comprises the group of binary, ternary or quaternary compounds containing at least one element from the third main group and at least one element from the fifth main group, such as nitride and phosphide compound semiconductors. Such a binary, ternary or quaternary compound may also contain, for example, one or more dopants and additional components.

The intermediate layer 11 is preferably doped, for example, n-doped.

In particular, it is possible that the intermediate layer 11 is formed with a nitride compound semiconductor material.

For example, the nitride compound semiconductor material is $Al_nGa_mIn_{1-n-m}N$ where $0 \leq n \leq 1$, $0 \leq m \leq 1$ and $n+m \leq 1$. This material does not necessarily have to have a mathematically exact composition according to the above formula. Rather, it may, for example, contain one or more dopants and additional components. For simplicity's sake, however, the above formula contains only the essential components of the crystal lattice (Al, Ga, In, N), even if these may be partially replaced and/or supplemented by small quantities of other substances.

In particular, the intermediate layer 11 may comprise several partial layers, each of which is parallel to the growth surface of substrate 2. For example, partial layers can be deposited in the following order on the substrate 2 as intermediate layer 11: GaN partial layer, AlN partial layer, AlGaN partial layer.

Figure 2C:

In a next method step, an insulating layer 12 formed with an electrically insulating material such as $SiO_2$ or SiN is applied to the side of the intermediate layer 11 facing away from the substrate. This is shown in FIG. 2C.

Figure 2D:
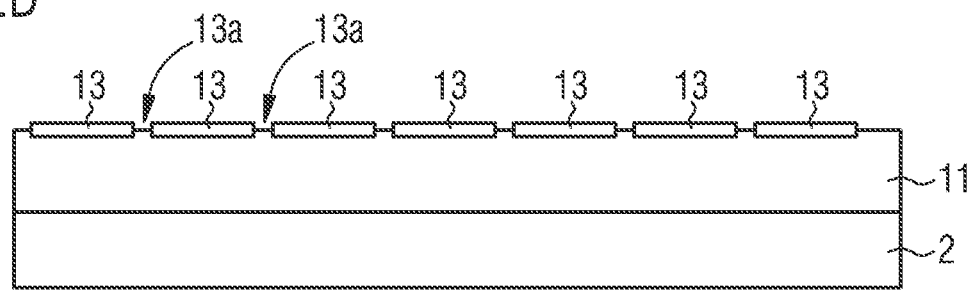

In the subsequent method step, FIG. 2D, the insulating layer 12 is structured into the mask layer 13 by making openings 13a in the insulating layer 12. The openings 13a, for example, run parallel to the M-axis M of the material of the intermediate layer 11 and are formed, for example, by line openings.

Figure 2E:
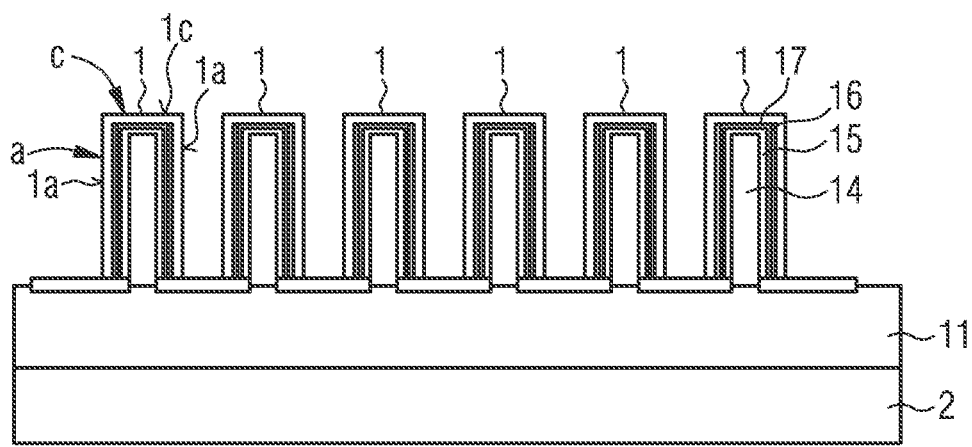

Finally, FIG. 2E, fins 1 are produced by selective growth by means of metal-organic vapor phase epitaxy in the area of the openings 13a of the mask layer 13.

For example, cores 14 are grown in the openings 13a. The cores 14 are GaN cores with n-type doping, for example.

On the core 14 of each fin 1 the first shell 15, the active region 16 on the side of the first shell 15 facing away from the core 14, and the second shell 17 on the side of the active region 16 facing away from the first shell are arranged. For example, the first shell 15 is n-doped and the second shell 17 is p-doped. The first shell 15, the active region 16 and the second shell 17 are based on the nitride compound semiconductor material AlInGaN, for example.

Figure 3A:
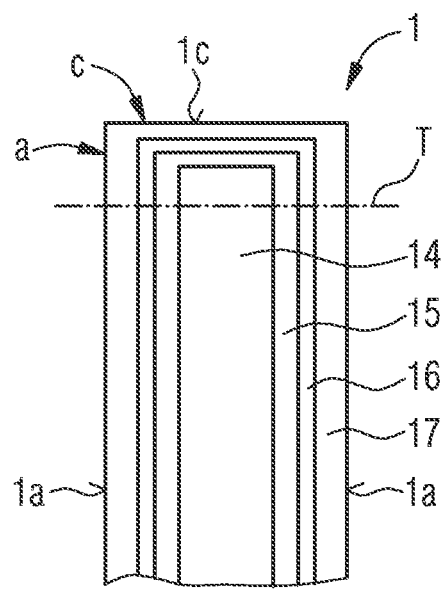
Figure 3B:
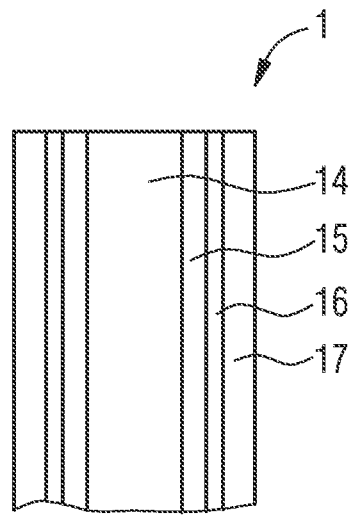

The schematic representations of FIGS. 3A and 3B show a correspondingly manufactured fin in detail. The active region 16 is arranged on the side surfaces 1a of the fin. The side surfaces 1a are oriented parallel to the A-plane a of the AlInGaN fin. On the cover surface 1c of the fin, these layers are parallel to the C-plane c of the semiconductor material of the fin 1. There, the layers mentioned are significantly thinner than the same layers on the side surfaces 1a. The indium and/or gallium content is/are also lower there at least for the active layer 16 than on the side surfaces 1a. Due to the different content of indium and/or gallium on the cover surface 1c, it is possible that electromagnetic radiation in a different wavelength range is generated there during operation than in the area of the side surfaces 1a. However, it is possible, as shown in conjunction with FIGS. 3A and 3B, to completely or partially remove the upper part of each fin 1, leaving only one active region 16 located on an A-plane a of the fin 1 and possibly a smaller area of the active region 16 located on the end surfaces 1d of the fin.

Figure 4A:
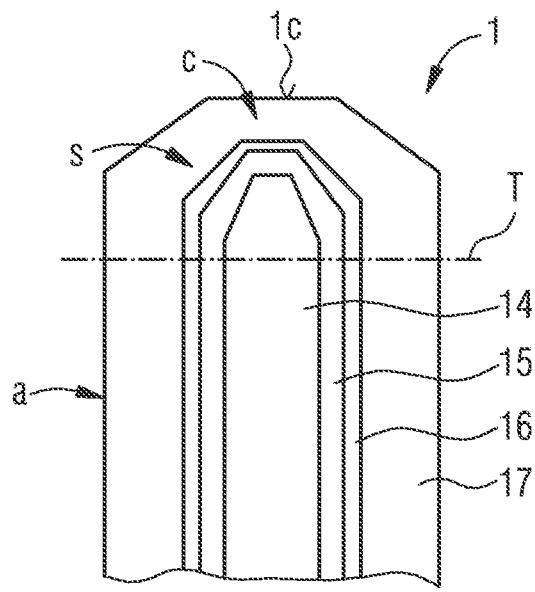
Figure 4B:
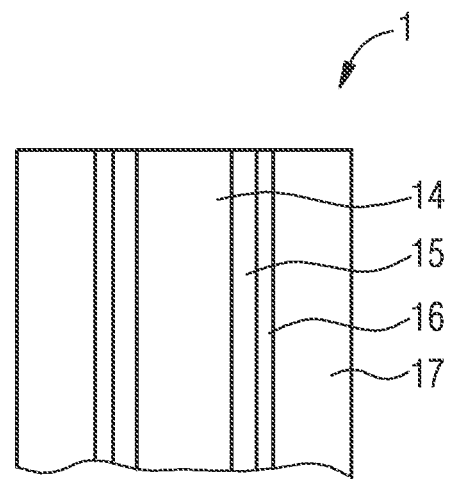

In connection with the schematic sectional representations of FIGS. 4A and 4B, an exemplary embodiment is shown in which the cover surface 1c of the fin has areas parallel to the C-plane c and areas parallel to a semi-polar plane s. Also in this case it is possible—to avoid effects due to different concentrations of gallium and/or indium—to remove the tip of the fin 1, see FIG. 4B.

In connection with FIGS. 5A to 13D, an exemplary embodiment of the manufacture of an optoelectronic semiconductor chip described here is explained in more detail.

According to this example, there is no pre-structuring of the shape of the optoelectronic semiconductor chips to be produced on the growth substrate 2. This means that the fins 1 can extend evenly over the entire growth substrate and thus the entire wafer without any pre-structuring with regard to the chip layout. As an advantage, semiconductor chips of different geometry can be produced from such a wafer. A disadvantage of such a manufacturing method is that it includes additional method steps for structuring the individual semiconductor chips.

Figure 5A:
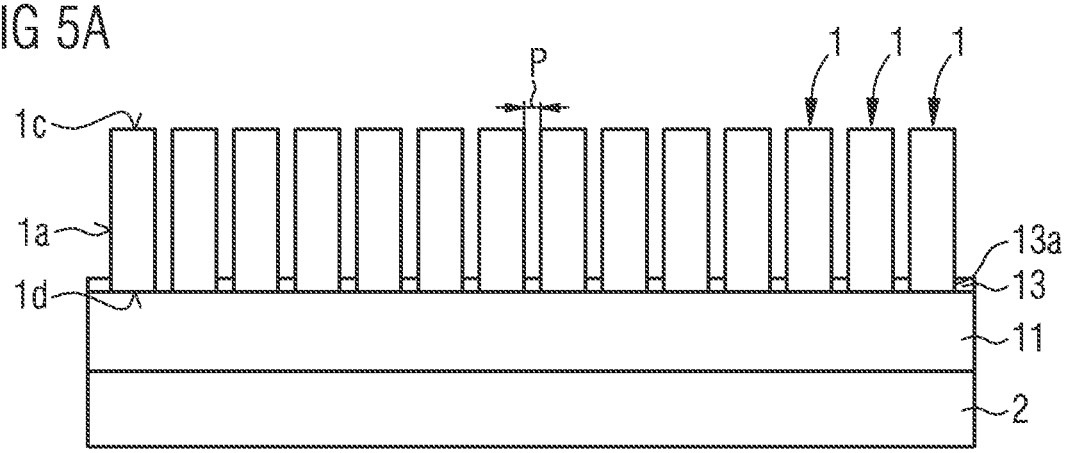
Figure 5B:
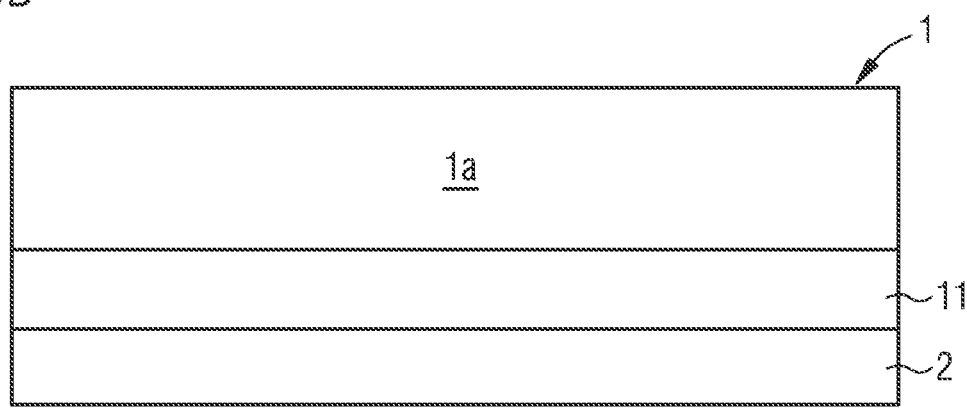
Figure 5C:
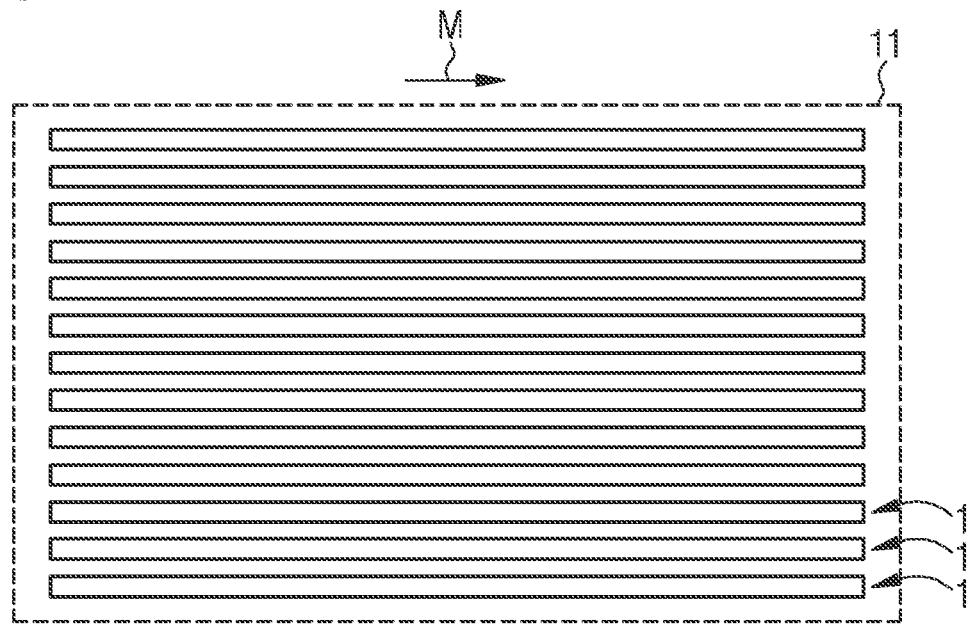

In the first step of the method, FIG. 5A, the fins 1 are produced as described in connection with FIGS. 2A to 2E. The mask layer 13 with its openings 13a extends regularly over the entire wafer, so that fins with a distance P of between, for example, 2 µm and 4 µm are grown over the entire wafer. FIG. 5A shows a sectional view in the direction of the fins 1, FIG. 5B shows a side view of the side surface is of a fin, and FIG. 5C shows a top view of the wafer.

Figure 6A:
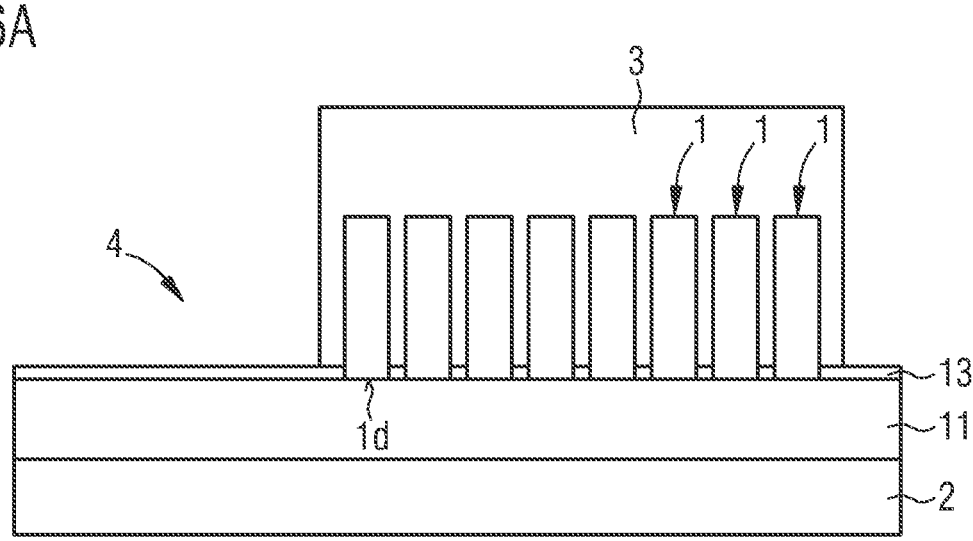
Figure 6B:
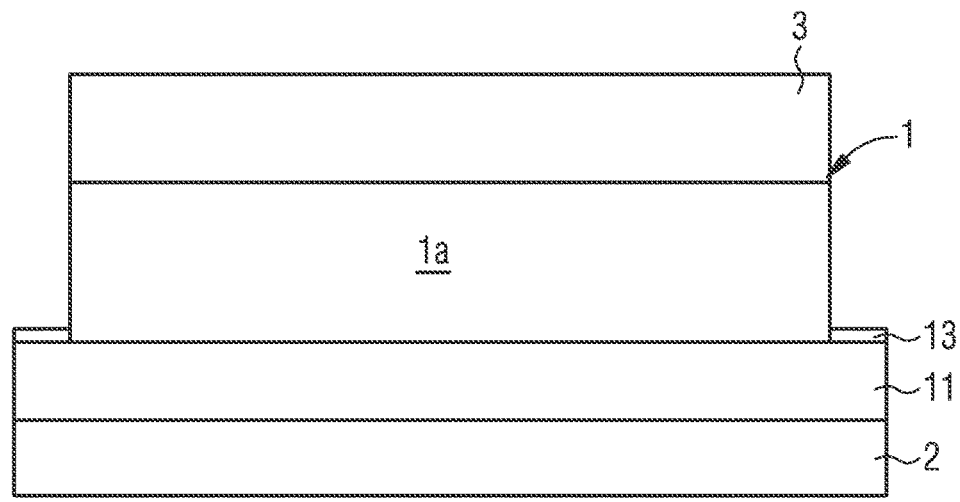
Figure 6C:
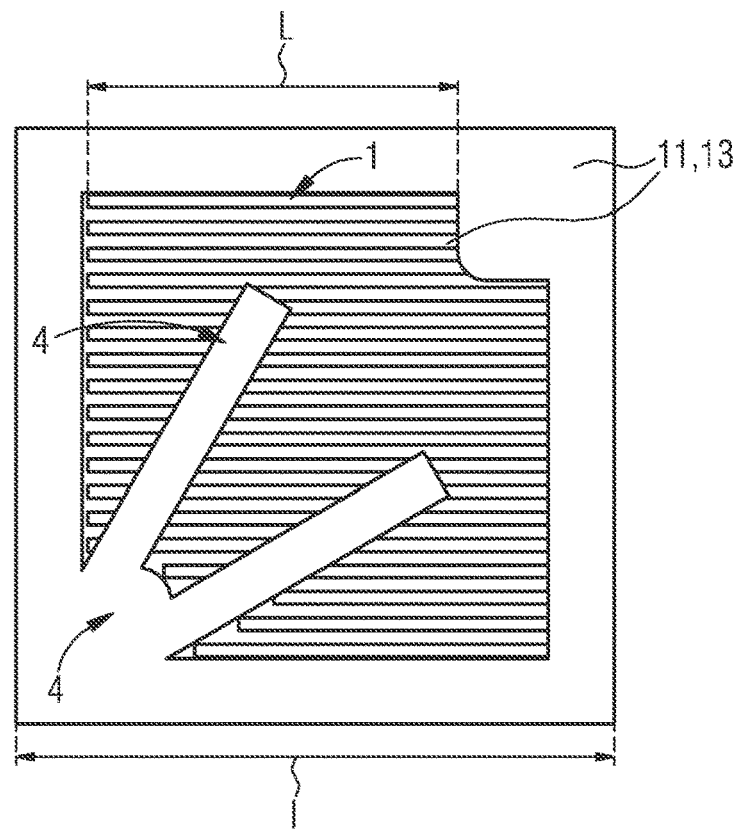

In the next method step, shown in connection with FIGS. 6A to 6C, a photoresist 3 is applied to a partial area of the fins 1, with the aid of which a free area 4 is produced, in which the fins 1 are removed, for example, by dry- or wet-chemical etching as well as by stripping. FIG. 6A again shows a sectional view in the direction of the fins 1, FIG. 6B shows a view of a side surface of a fin, and FIG. 6C shows the view from above in a top view. The layout of the optoelectronic semiconductor chip to be produced is defined by the production of the free areas 4. FIG. 6C therefore shows the edge length 1 of the optoelectronic semiconductor chip and the length L of the fins 1. In the free area 4, for example, the intermediate layer and/or the mask layer 13 is/are exposed.

Figure 7:
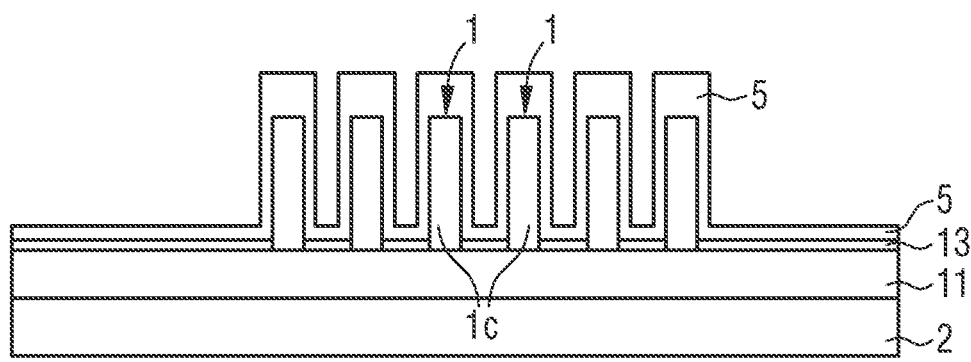

In the next method step, FIG. 7, the photoresist 3 is removed and an electrically insulating layer 5 is deposited conformally on the top side of the arrangement so that all fins 1 are uniformly covered by the electrically insulating layer 5. For example, the electrically insulating layer 5 can be applied by a coating process such as sputtering or CVD.

Figure 8A:
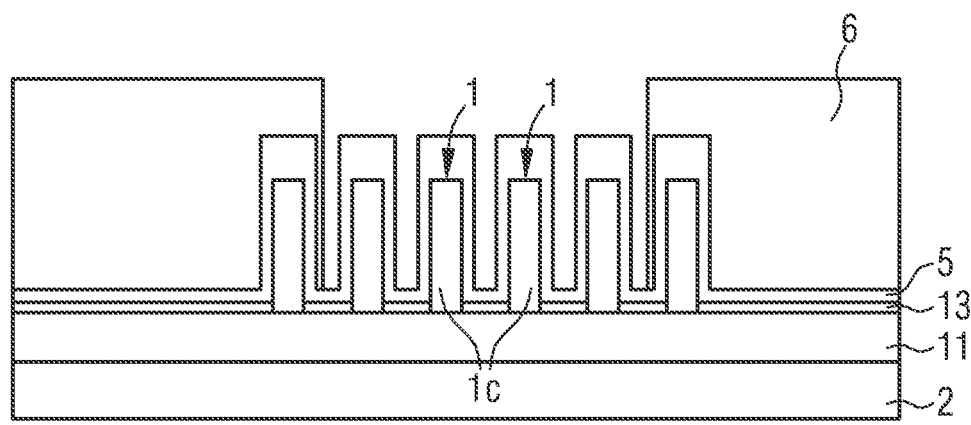
Figure 8B:
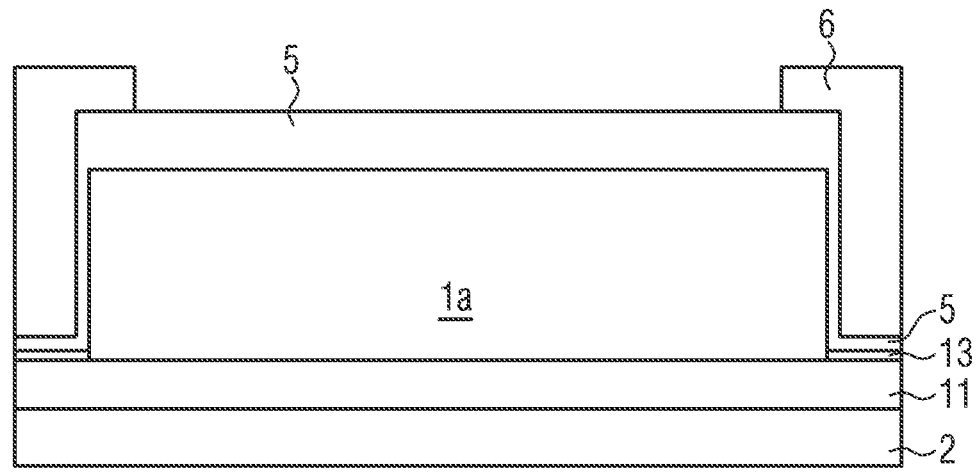
Figure 9A:
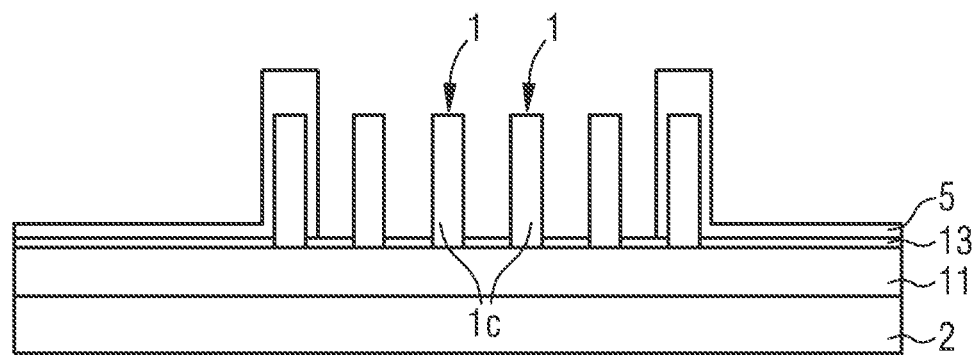
Figure 9B:
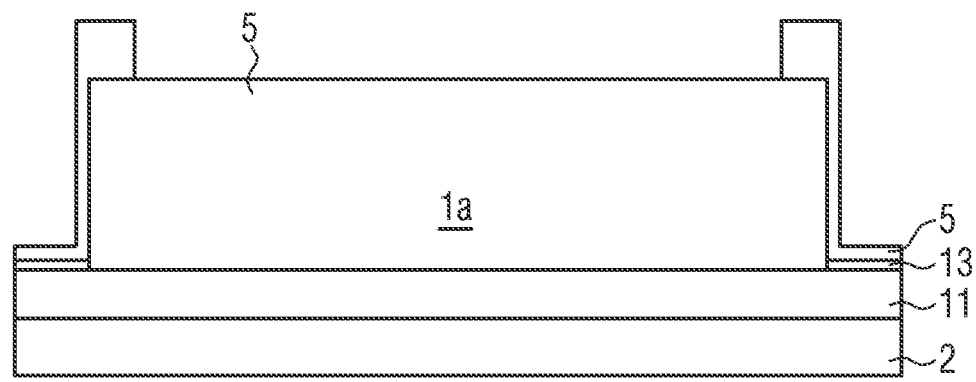

FIGS. 8A and 8B show the application of a further photoresist 6 in such a way that the outer fins 1, which only have an adjacent fin on one side, are covered by the photoresist 6 and the remaining fins remain uncovered by the photoresist. The photoresist is used in the following method step, shown in connection with FIGS. 9A and 9B, to remove the electrically insulating layer 5 from the inner fins 1.

Figure 10A:
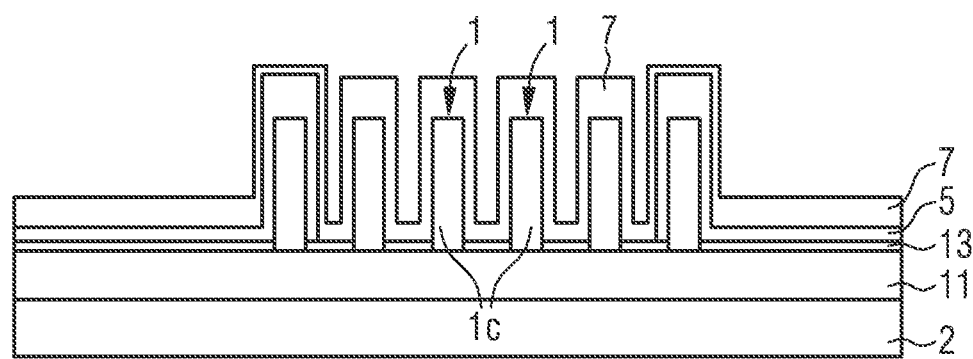
Figure 10B:
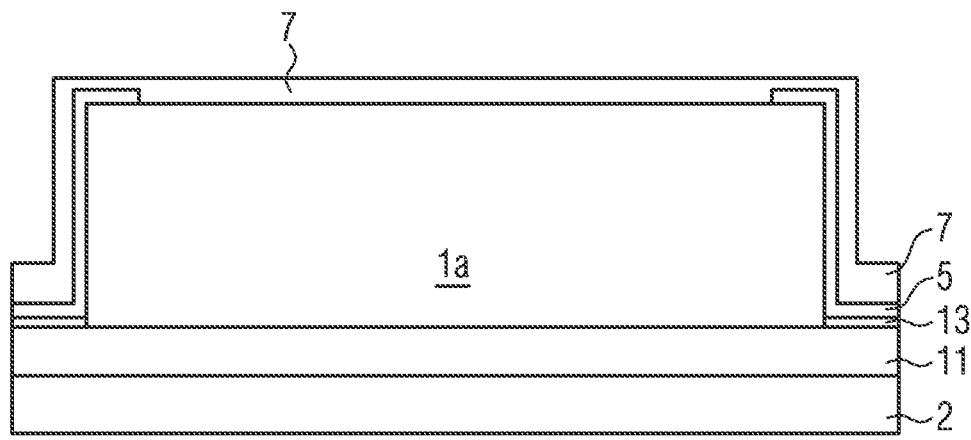

In the following method step, see FIGS. 10A and 10B, a current expansion layer 7 is deposited conformally on the upper side of the arrangement. The current expansion layer 7 is in direct contact with the inner fins 1 on their outside, for example, on the second shell 17. The current expansion layer 7 is preferably radiation-transmissive, for example, it is formed with a TCO (Transparent Conductive Oxide) material such as ITO. The current expansion layer 7 is used, for example, for common, p-side contacting of the fins 1 covered by it.

FIGS. 10A, 10B again show the different views along the fins 1 and on a side surface is of the fins.

Figure 11A:
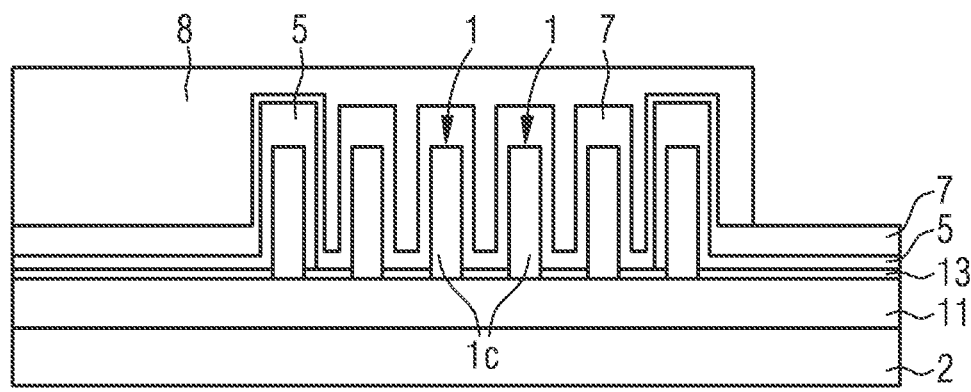
Figure 11B:
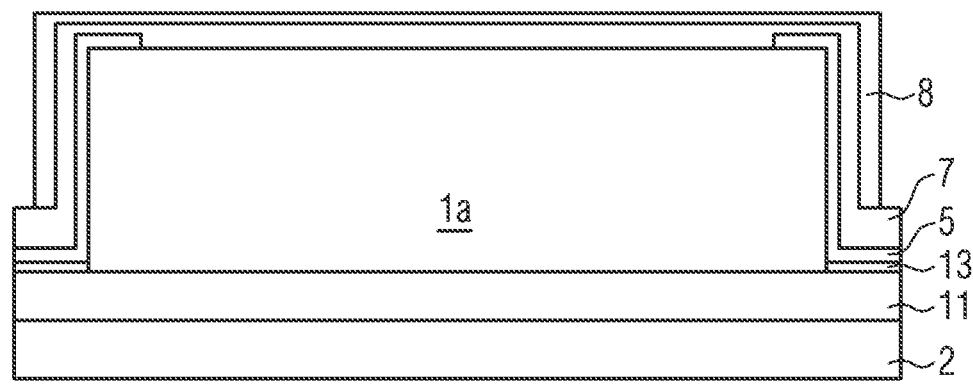
Figure 12A:
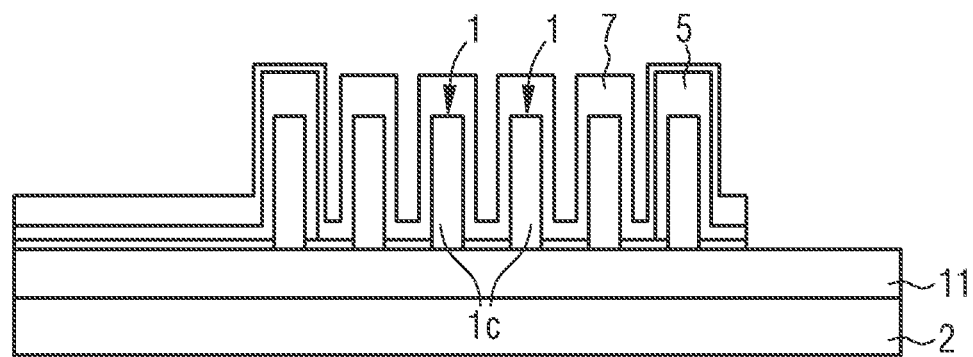
Figure 12B:
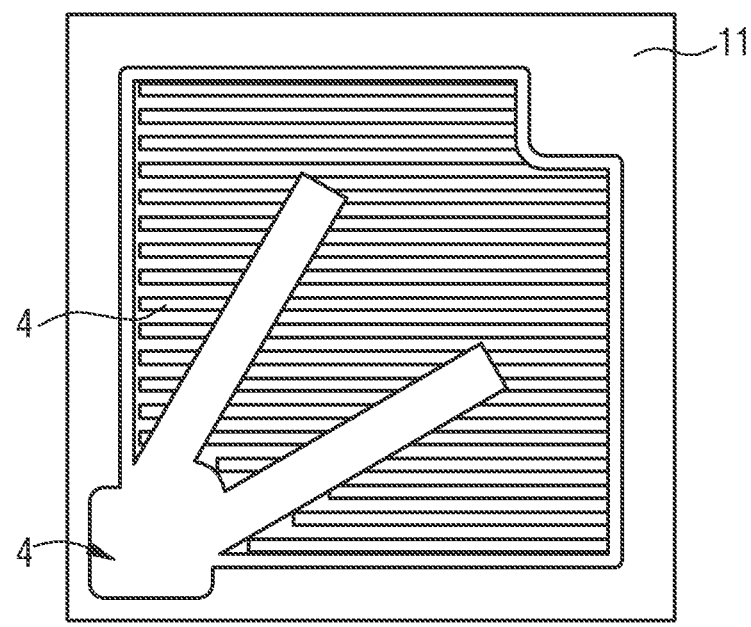

In the next method step, compare FIGS. 11A and 11B, all fins 1 are covered by a photoresist 8. This is done to expose the intermediate layer 11 in a partial area, see FIGS. 12A and 12B.

In the next method step, FIGS. 13A, 13B, the contact layers 9a, 9b are applied for n-side or p-side contacting. The contact layer 9a is in direct contact with the intermediate layer 11 and can be designed in such a way that it almost completely surrounds all fins 1 laterally. For this purpose it has an appropriately designed contact finger 91a. Only where the p-side contact layer 9b is formed is the n-side contact layer 9a not located. From the p-side contact layer 9b, contact fingers 91b extend into the field of fins 1 to contact the current expansion layer 7 there. After separating the wafer, an optoelectronic semiconductor chip results as shown in FIGS. 13A and 13B.

In connection with FIGS. 14A to 17B, an alternative method is described in which the mask layer 13 is already pre-structured with regard to the chip layout. This means that the mask layer 13 has no openings 13a in the edge region of each optoelectronic semiconductor chip to be manufactured, so that no fins 1 are produced there which would have to be removed in the course of the process. In addition, the areas in which the p-contact layer 9b will later be applied, for example, the contact fingers 91b, are already provided in the mask layer 13. Also in this area there is no opening of the mask layer.

Figure 14A:
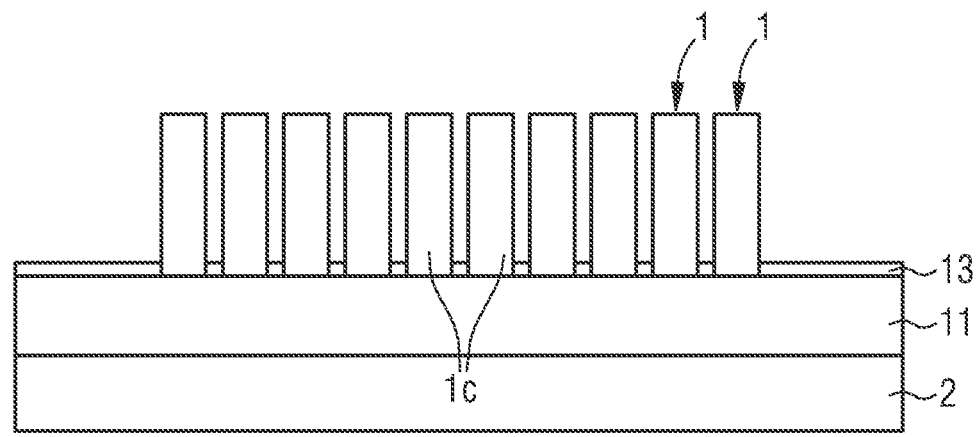
Figure 14B:
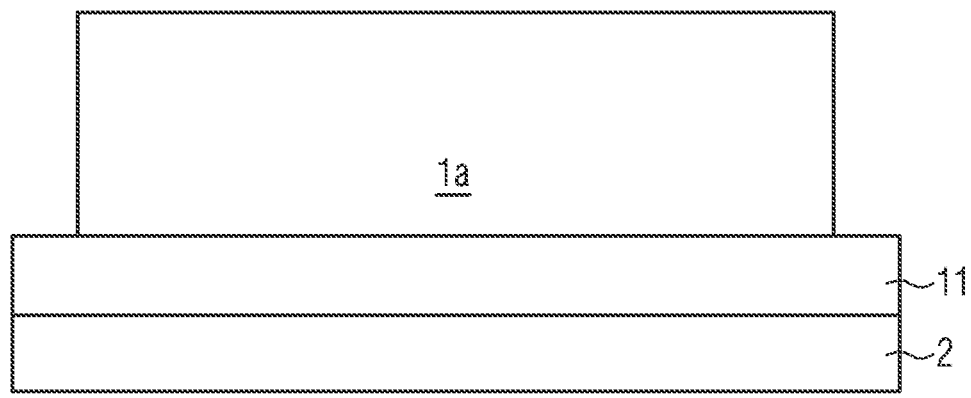
Figure 14C:
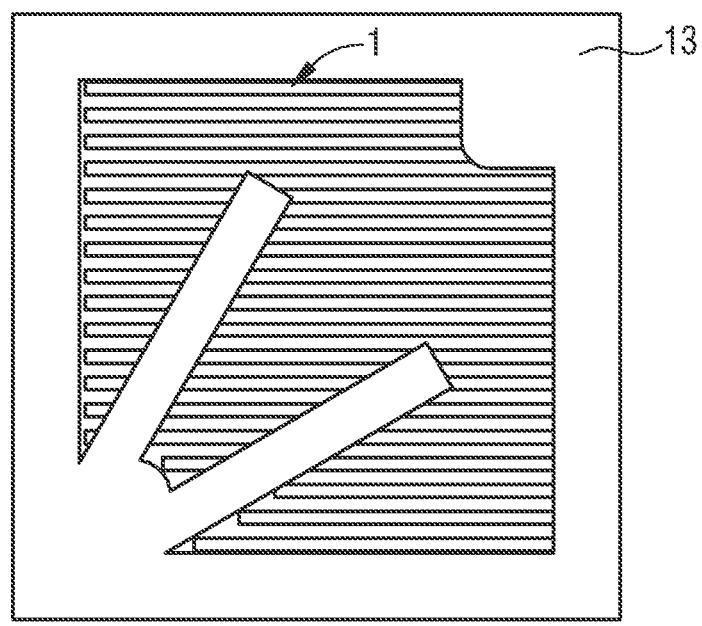

This results in the fins 1 as they are shown in the different views of FIGS. 14A, 14B and 14C.

Figure 15A:
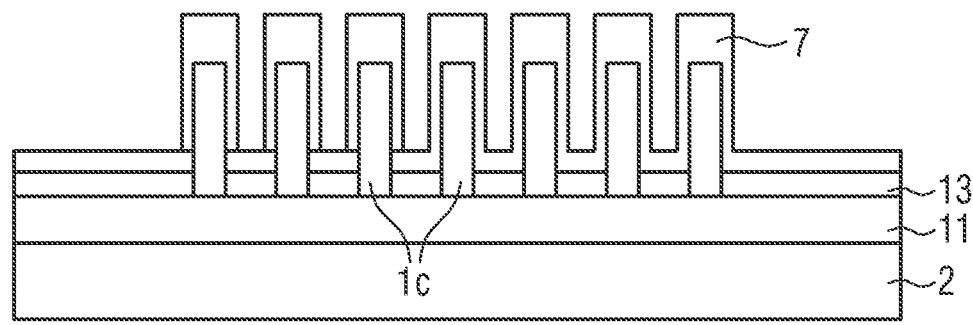
Figure 15B:
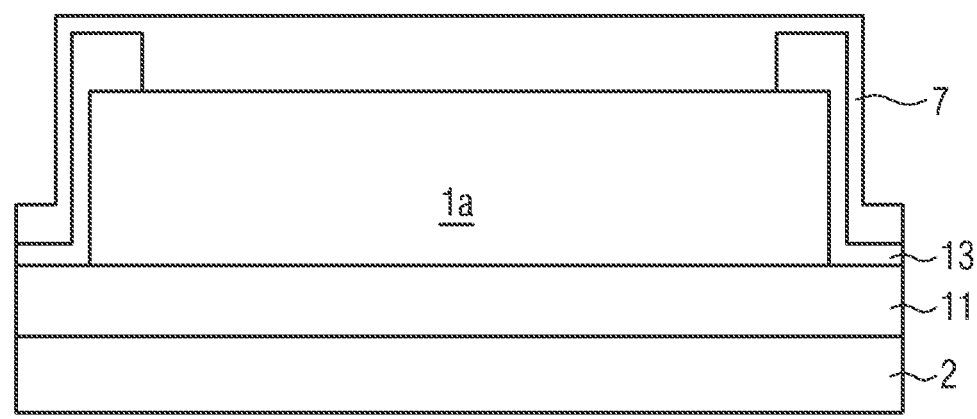

In the next method step, FIGS. 15A, 15B, the insulating layer 5 is optionally applied. Subsequently, the current expansion layer 7 is deposited conformally.

Figure 16A:
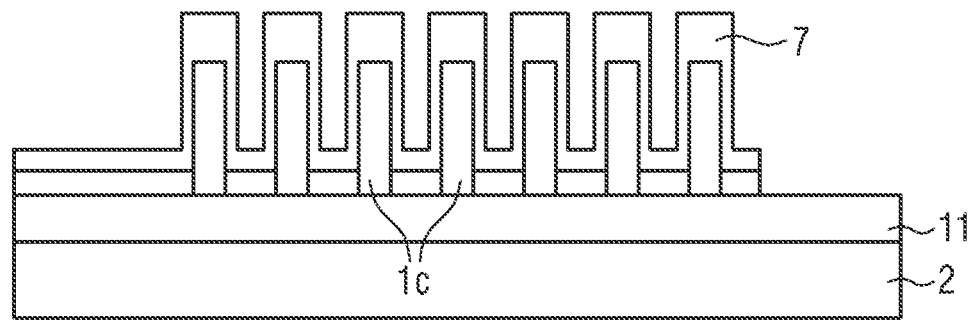
Figure 16B:
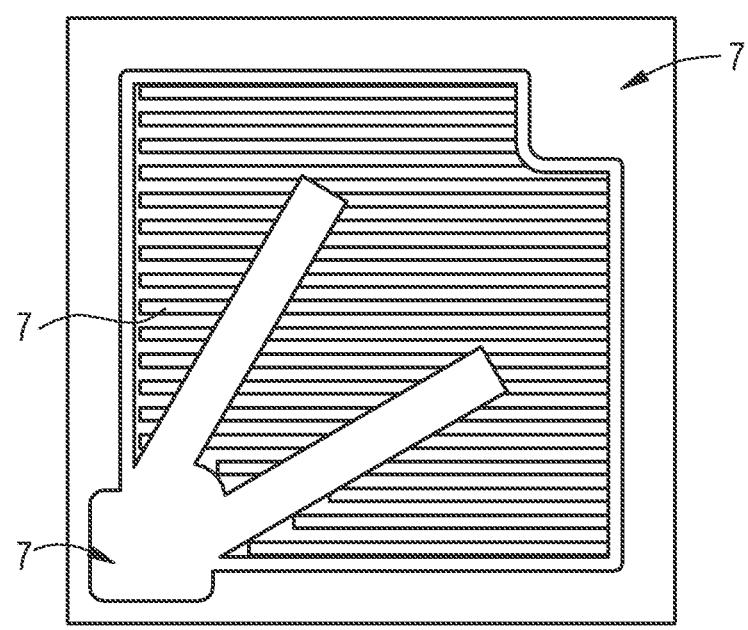

In the following method step, FIGS. 16A, 16B, the current expansion layer 7, the mask layer 13 and, if necessary, the uppermost layers of the intermediate layer 11 are removed with the aid of a photomask which is not shown. In this way, the intermediate layer 11 is exposed in a free area 4.

Figure 17C:
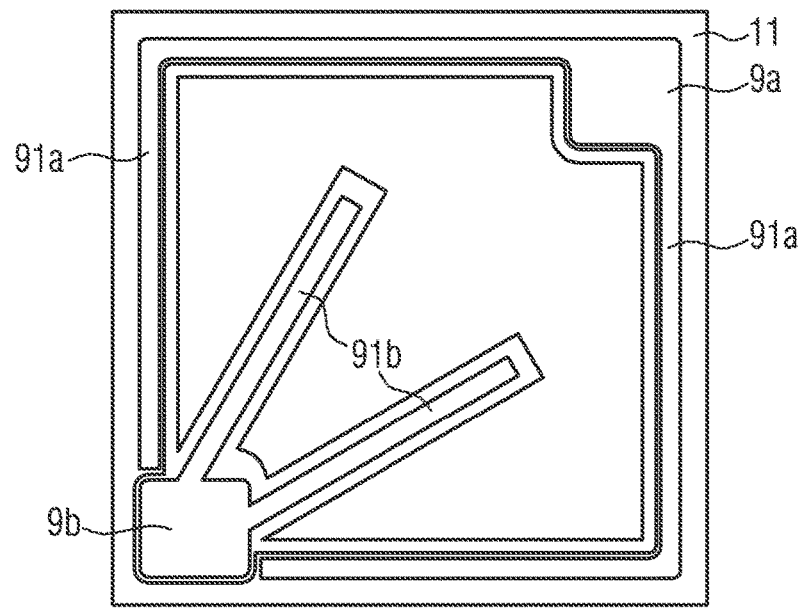

In the following method step, FIGS. 17A, 17B, 17C, the contact layers 9a, 9b are applied.

In connection with FIG. 17A, a variant is described in which the current expansion layer 7 and the fin 1 are removed in the upper area of each fin 1 to avoid effects due to different concentrations of gallium and/or indium at the tip of the fin 1. This corresponds, for example, to the embodiments of FIGS. 3B and 4B. The removal can be done with the following steps:

First a planarization is carried out with the help of a lacquer or an oxide. This is followed by removal of the above areas by polishing and/or plasma-assisted etching and/or wet chemical etching. The entire remaining area can then be covered by one or more oxide layers 18.

Alternatively, in a particularly simple variant, which is therefore particularly easy to produce, the upper areas of each fin are not removed. This is shown in FIG. 17B.

An optoelectronic semiconductor chip described here is characterized among other things by a high aspect ratio, i.e., the ratio between height and width of each fin 1 is at least 2.

Furthermore, with an optoelectronic semiconductor chip described here, it is possible to form the fins 1 parallel to an M-axis, whereby the active regions 16 can be generated on an A-plane. The active regions 16 are generated almost exclusively on the side surfaces is of the fins 1 and thus on the A-plane, so that at least 90% of the active region is generated on an A-plane. This also applies to the other layers of each fin, such as the shells 15, 17. This makes an optoelectronic semiconductor chip possible that can be operated particularly efficiently due to the avoidance of the Auger effect, a particularly low defect density and the avoidance of piezoelectric fields. In addition, the fins exhibit increased mechanical stability compared to microrods, for example, which simplifies the manufacture of optoelectronic semiconductor chips in particular. In addition, the fins have fewer corners and areas of different orientation, which enables radiation-emitting semiconductor chips, for example, to emit light in a particularly narrow wavelength range.

In connection with FIGS. 18A and 18B, a further exemplary embodiment of an optoelectronic semiconductor chip described here is explained in more detail using schematic representations. In this exemplary embodiment the conductive intermediate layer 11 is omitted. This means that the semiconductor chip is free of the intermediate layer 11. The mask 13, for example, is applied directly to a growth substrate 2. The fins 1 are arranged in the openings of the mask 13.

Due to the omission of the intermediate layer 11, which in the previous exemplary embodiments represents an electrically conductive buffer layer for n-side contacting of the fins 1, there is increased freedom in the choice of the substrate 2. For example, sapphire substrates or AlN layers on any substrates can be used as substrates, whereby the manufacturing process can be made much simpler and cheaper.

As shown in the sectional view of FIG. 18B, in some areas, for example, at the longitudinal ends of the fins 1, the fins 1 are structured in such a way that the core 14 of each fin is exposed. For example, the core 14 can be n-conductive. For n-conducting contacting, a contact finger 91a then extends in direct contact with the cores 14 over the fins 1 in the areas where the core 14 is exposed in a direction transverse or perpendicular to the main extension direction of the fins 1. The core 14 can, for example, be exposed by etching, i.e., the remaining layers of each fin 1 are removed.

A current expansion layer 7 is applied over the remaining length of the fins 1 to the p-conductive second shell 17, for example. On the current expansion layer 7, which is formed, for example, with a TCO material, p-conductive contact fingers 91b are applied perpendicularly or transversely to the main direction of extension of the fins 1, for example.

For contacting the contact fingers 91a, 91b, the contact layers 9a, 9b can extend parallel to the fins 1, for example, along the outermost fins 1, which electrically connect the corresponding contact fingers 91a, 91b with each other and which can be electrically contacted from the outside. The contact layers 9a, 9b are designed, for example, as metal strips along the main extension direction of the fins 1. These metal strips can be formed with a highly reflective metal in order to minimize emission shadowing. Alternatively or additionally it is possible to apply these metal strips in the intermediate areas between the fins 1.

The invention is not limited to the exemplary embodiments by the description using the same. Rather, the invention includes any new feature and any combination of features, which in particular includes any combination of features in the patent claims, even if that feature or combination itself is not explicitly mentioned in the patent claims or exemplary embodiments.

The invention claimed is:

1. An optoelectronic semiconductor chip comprising:
   a plurality of fins; and
   a current expansion layer for common contacting of at least some of the fins, each fin comprising:

two side surfaces arranged opposite one another; and
an active region arranged on each of the side surfaces,
wherein the plurality of fins comprises inner fins and outer fins having an adjacent fin only on one side,
wherein the current expansion layer is in direct contact with the inner fins on their outside, and
wherein at least one of the plurality of fins has a length which is at least 50% of an edge length of the semiconductor chip.

2. The optoelectronic semiconductor chip according to claim 1,
wherein at least one of the plurality of fins has end surfaces and a cover surface, and
wherein an area of each side surface is greater than an area of each end surface and an area of the cover surface.

3. The optoelectronic semiconductor chip according to claim 1,
wherein at least one of the plurality of fins is based on a III-V compound semiconductor material, and
wherein the side surfaces are parallel to an A-plane of a III-V compound semiconductor material.

4. The optoelectronic semiconductor chip according to claim 3,
wherein at least one of the plurality of fins extends parallel to a M-axis of the III-V compound semiconductor material.

5. The optoelectronic semiconductor chip according to claim 1,
wherein at least one of the plurality of fins has a length, a width and a height,
wherein the height is greater than the width, and
wherein a ratio of height to width is at least 2.

6. The optoelectronic semiconductor chip according to claim 5, wherein the length is greater than the height.

7. The optoelectronic semiconductor chip according to claim 1,
wherein at least one of the plurality of fins has a core formed with a III-V compound semiconductor material of a first conductivity type and/or the fin has a first shell formed with a III-V compound semiconductor material of a first conductivity type,
wherein the fin has a second shell formed with a III-V compound semiconductor material of a second conductivity type different from the first conductivity type, and
wherein the active region of the fin is arranged between a core and the first shell and/or the core and the second shell.

8. The optoelectronic semiconductor chip according to claim 7, wherein the core is exposed in at least one fin and the core is covered by a contact finger.

9. The optoelectronic semiconductor chip according to claim 8, wherein the second shell of the fin is covered in places by the current expansion layer.

10. The optoelectronic semiconductor chip according to claim 1, wherein the plurality of fins is arranged parallel to each other.

11. The optoelectronic semiconductor chip according to claim 1, wherein some of the fins are arranged one behind the other along a straight line, a length of the fins extending along the straight line.

12. The optoelectronic semiconductor chip according to claim 1, wherein the fins have active regions of the same design.

13. The optoelectronic semiconductor chip according to claim 1, wherein the current expansion layer is radiation-transmissive and comprises a TCO (Transparent Conductive Oxide) material.

14. The optoelectronic semiconductor chip according to claim 1, wherein the outer fins are covered with an insulating layer which directly adjoins the outer fins and the current expansion layer and electrically insulates the outer fins from the current expansion layer.

15. An optoelectronic semiconductor chip comprising:
a plurality of fins; and
a current expansion layer for common contacting of at least some of the fins, each fin comprising:
two side surfaces arranged opposite one another; and
an active region arranged on each of the side surfaces,
wherein the plurality of fins comprises inner fins and outer fins having an adjacent fin only on one side,
wherein the current expansion layer is in direct contact with the inner fins on their outside, and
wherein some of the fins are arranged one behind the other along a straight line, a length of the fins extending along the straight line.

16. An optoelectronic semiconductor chip comprising:
a plurality of fins; and
a current expansion layer for common contacting of at least some of the fins, each fin comprising:
two side surfaces arranged opposite one another; and
an active region arranged on each of the side surfaces,
wherein the plurality of fins comprises inner fins and outer fins having an adjacent fin only on one side,
wherein the current expansion layer is in direct contact with the inner fins on their outside, and
wherein the outer fins are covered with an insulating layer which directly adjoins the outer fins and the current expansion layer and electrically insulates the outer fins from the current expansion layer.

* * * * *